United States Patent [19]

Matsuda

[11] Patent Number: 5,404,106
[45] Date of Patent: Apr. 4, 1995

[54] BATTERY CAPACITY ESTIMATING SYSTEM AND METHOD

[75] Inventor: Kazuhiko Matsuda, Musashino, Japan

[73] Assignee: Fuji Jukogyo Kabushiki Kaisha, Tokyo, Japan

[21] Appl. No.: 234,111

[22] Filed: Apr. 28, 1994

[30] Foreign Application Priority Data

May 26, 1993 [JP] Japan .................. 5-124348

[51] Int. Cl.⁶ .............................. G01R 27/26
[52] U.S. Cl. ...................... 324/431; 364/481; 364/483; 324/427
[58] Field of Search .............. 320/48; 340/636; 364/481, 483; 324/427, 429, 430, 431, 433

[56] References Cited

U.S. PATENT DOCUMENTS

| | | | |
|---|---|---|---|
| 4,290,099 | 9/1981 | Taniguchi | 364/481 |
| 4,333,149 | 6/1982 | Taylor et al. | 364/481 |
| 4,888,716 | 12/1989 | Ueno | 364/481 |
| 4,947,123 | 8/1990 | Minezawa | 324/431 |
| 4,965,738 | 6/1990 | Bauer et al. | 364/483 |
| 4,994,728 | 2/1991 | Sasaki | 324/427 |
| 5,047,961 | 9/1991 | Simonsen | 364/483 |
| 5,079,716 | 1/1992 | Lenhardt et al. | 364/483 |
| 5,193,067 | 3/1993 | Sato et al. | 324/431 |
| 5,281,919 | 1/1994 | Palanisamy | 324/427 |
| 5,321,627 | 6/1994 | Rehun | 324/431 |
| 5,345,392 | 9/1994 | Mito et al. | 324/431 |
| 5,349,540 | 9/1994 | Birkle et al. | 324/427 |

*Primary Examiner*—Maura K. Regan
*Attorney, Agent, or Firm*—Beveridge, DeGrandi, Weilacher & Young

[57] ABSTRACT

A remaining capacity estimating system and method for an automobile battery capable of estimating and displaying an accurate remaining battery capacity by calculating an internal resistance value of the battery based on a terminal voltage in a disconnected state to electrical loads, a terminal voltage in a selectively connected state to an electrical load and a discharge current value in this connected state, then obtaining a remaining battery capacity at the present temperature condition from a map showing a relationship among a remaining battery capacity, a discharge current and an internal resistance, and finally transforming the obtained remaining battery capacity into a remaining battery capacity at a standard temperature condition.

12 Claims, 5 Drawing Sheets

BATTERY CAPACITY ESTIMATING SYSTEM AND METHOD

BACKGROUND OF THE INVENTION

1. Field of the Invention

The present invention relates to a capacity estimating system and method for a rechargeable storage battery of an automobile and, more specifically, to a capacity estimating system and method capable of accurately estimating and displaying a remaining capacity of a battery, i.e., a remaining amount of dischrgeable electric energy in a battery, regardless of a state of degradation of plates or electrolyte temperature.

2. Description of the Prior Art

Rechargeable storage batteries are used in a wide variety of applications in automobiles, such as electrical power sources for auxiliary equipments, lighting equipments, or propulsion power sources for electric vehicles. Therefore, it is important for a vehicle operator to monitor a remaining capacity of a battery (referred to as "battery capacity" hereinafter), because he or she can know when a battery should be replaced with a new one next, or in case of an electric vehicle, when and where batteries should be recharged next.

There have ever been proposed miscellaneous technologies to estimate a battery capacity of a vehicle battery. Among them, Japanes patent application laid-open No. 26587 (1988) discloses a technology in which a battery capacity is predicted by referring to a charging/discharging characteristic map of the vehicle battery based on values of voltage, current and time during charging and discharging of battery.

However, in this prior art, when positive or negative plates of batteries are deteriorated, since an actual degree of deterioration of the battery plates is not reflected accurately, estimation accuracy of the battery capacity becomes low. Further, when temperature of electrolyte is high, the battery capacity tends to be estimated to be higher than an actual one.

SUMMARY OF THE INVENTION

In view of the foregoing disadvantages, an object of the present invention is to provide a battery capacity estimating system and method which can predict a battery capacity of a vehicle battery more accurately regardless of the deterioration state of positive or negative plates.

Another object of the present invention is to provide a battery capacity estimating system and method capable of estimating and displaying a remaining battery capacity at the standard condition at any time, regardless of the present electrolyte temperature.

The present invention has been made based upon a knowledge that a remaining capacity of a battery is dependent on a density of electrolyte and the density of electrolyte has a correlation with an internal resistance of the battery and with a discharge current from a battery.

To achieve above objects, the battery capacity estimating system according to the present invention is provided with:

first switching means responsive to a command signal from an electronic control unit for setting the battery in a disconnected state to all of electrical loads of the automobile except the electronic control unit; second switching means responsive to another command signal from the electronic control unit for setting the battery in a selectively connected state to an electrical load excluding the electronic control unit; first voltage detecting means for detecting a first voltage between a positive and negative terminal of the battery in the disconnected state; second voltage detecting means for detecting a second voltage between a positive and negative terminal of the battery in the selectively connected state; discharge current detecting means for detecting a discharge current flowing between the battery and the electrical load in the selectively connected state; temperature sensing means for sensing an electrolyte temperature of the battery; input signal converting means for converting analogue signals of the first voltage signal, the second voltage signal, the discharge current signal and the electrolyte temperature signal, into digital signals and for outputting the digital signals to a CPU of the electronic control unit; internal resistance calculating means for calculating an internal resistance value of the battery based on the first voltage signal from the input signal converting means, the second voltage signal from the input signal converting means and the discharge current signal from the input signal converting means and for outputting the internal resistance value; capacity data memory means for storing a remaining capacity level of the battery on a first map parameterizing an internal resistance value and a discharge current value; capacity estimating means for reading the remaining capacity level corresponding to the internal resistance value and the discharge current value on the first map and for outputting the remaining capacity level; correction coefficients memory means for storing a temperature correction coefficient on a second map parameterizing an electrolyte temperature; capacity correcting mean for reading the temperature correction coefficient corresponding to the electrolyte temperature on the second map, for correcting the remaining capacity level outputted from the capacity estimating means by the temperature correction coefficient, and for outputting a corrected remaining capacity level; and display means for displaying the corrected remaining capacity level outputted from the temperature correcting means.

Next, a brief description about a function of the battery capacity estimating system according to the present invention will be made.

First, in first switching means a battery is set at a disconnected state to all of electrical loads excepting a control unit and a terminal voltage (VH) is detected at this disconnected state. Then, in second switching means the battery is set at a connected state to a part of the electrical loads and a terminal voltage (VL) is detected at this partly connected state and at the same time a discharge current (I) from the battery to the loads is detected. These series of operations are performed within a very short period of time. Further, in temperature sensing means an electrolyte temperature (t) of the battery is sensed. Signals thus detected and sensed are inputted to the input signal converting means in which they are converted into digital signals.

Then, in the internal resistance calculating means, the terminal voltage at the disconnected state (VH) is subtracted by the terminal voltage at the partly connected state (VL) and an internal resistance value (r) of the battery is obtained by dividing the obtained voltage drop value (VH−VL) by the above discharge current value (I).

In the above description of operation, at first the terminal voltage (VH) at the disconnected state is detected and then the terminal voltage (VL) at the partly connected state is detected, however reversing this order does not have influence on the effect of the present invention at all.

Further, next in the capacity estimating means, a battery capacity of the battery is obtained by referring to a capacity data map based on the calculated internal resistance value (r) and the discharge current value (I).

Finally, in the capacity correcting means, the obtained battery capacity is corrected in accordance with the electrolyte temperature (t) and then in the display means the corrected battery capacity of the battery is displayed.

BRIEF DESCRIPTION OF THE DRAWINGS

The present invention will be described hereinafter in connection with the accompanying drawings, in which.

DETAILED DESCRIPTION OF THE PREFERRED EMBODIMENT

Figure 1:
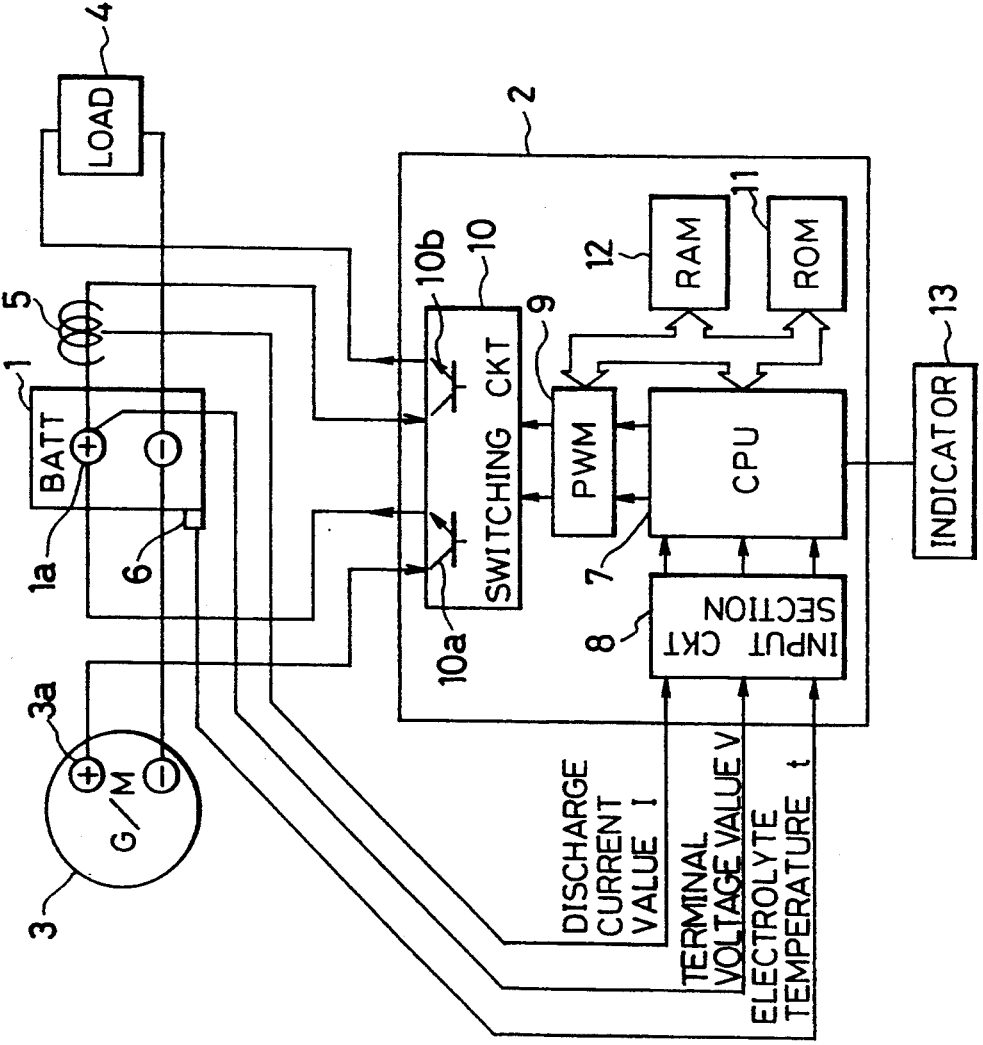
FIG. 1 is a diagrammic view showing an entire composition of a preferred embodiment of the battery capacity estimating system as installed on a vehicle (not shown) according to the present invention.

Referring now to FIG. 1, numeral 1 denotes a battery whose terminals are connected to a generator 3 and a load 4 through a control unit 2. The control unit 2 is also connected to the battery 1 to be always supplied with electrical power from the battery 1, although this is not shown in FIG. 1. A current detector 5 for detecting current by means of electromagnetic induction is disposed on a circuit between a terminal 1a of the battery 1 and the load 4. Further, an electrolyte temperature sensor 6 forming temperature sensing means is mounted on the battery 1.

The control unit 2 comprises a CPU 7 forming a major component of the control unit 2, an input circuit section 8 for feeding signals to the CPU 7, a switching circuit section 10 driven by the CPU 7 via a PWM (Pulse Wide Modulator) 9, a ROM 11 and a RAM 12 both of which are connected to the PWM 9 and the CPU 7 for data communication 18 therebetween. Further, an indicator 13 for displaying a result of calculation is connected to the control unit 2 (to the CPU 7 therein).

A discharge current value I from the current detector 5, an electrolyte temperature t from the electrolyte temperature sensor 6 and a terminal voltage value V from the terminal 1a of the battery 1 are inputted as analogue signals to the input circuit section 8 of the control unit 2 and these signals are outputted to the CPU 7 after being converted into digital signals.

The switching circuit section 10 has a switching transistor 10a connecting a positive terminal 3a of the generator 3 and the positive terminal 1a of the battery 1, and a switching transistor 10b connecting the positive terminal 1a of the battery 1 and the load 4. The switching transistor 10a forming first switching means and the switching transistor 10b forming second switching means are normally at an energized (ON) condition. However, while a command signal from the CPU 7 is applied for a very short period of time, both switching transistors 10a and 10b are turned off to disconnect a circuit between the terminal 1a of the battery 1 and the terminal 3a of the generator 3, and a circuit between the terminal 1a and the load 4. After a very short time is elapsed, only the switching transistor 10b is returned to an ON condition to connect to the load 4. On the other hand, the switching transistor 10a is also returned to an ON condition after further a very short period of time is elapsed.

Figure 2:
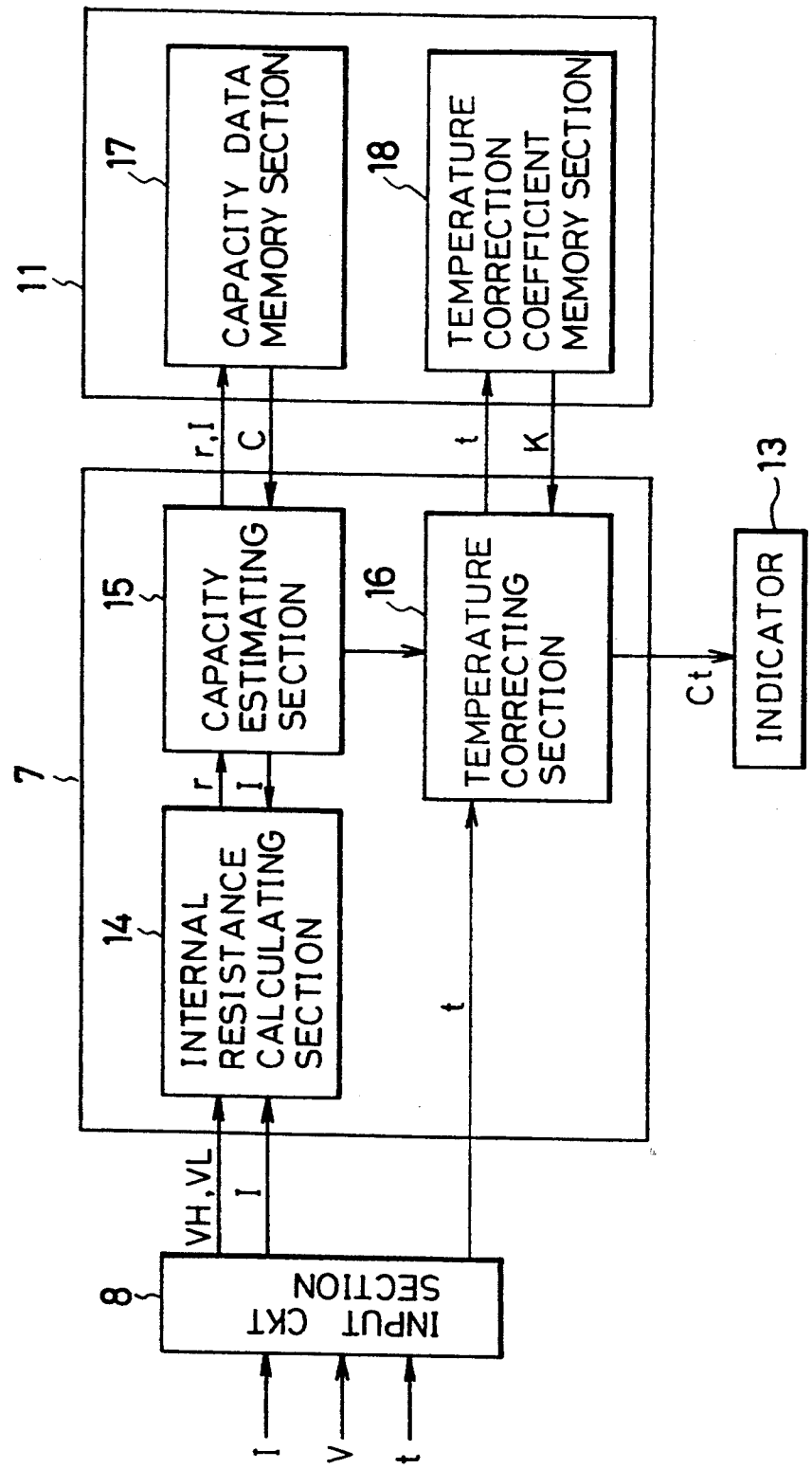
FIG. 2 is a block diagram showing functional sections of the control unit according to a preferred embodiment of the invention.

Referring to FIG. 2, the CPU 7 comprises an internal resistance calculating section 14 forming internal resistance calculating means, a capacity estimating section 15 forming capacity estimating means and a temperature correcting section 16 forming capacity correcting means. Further, the ROM 11 comprises a capacity data memory section 17 forming capacity data memory means and a temperature correction coefficient memory section 18 forming correction coefficients memory means.

Figure 3:
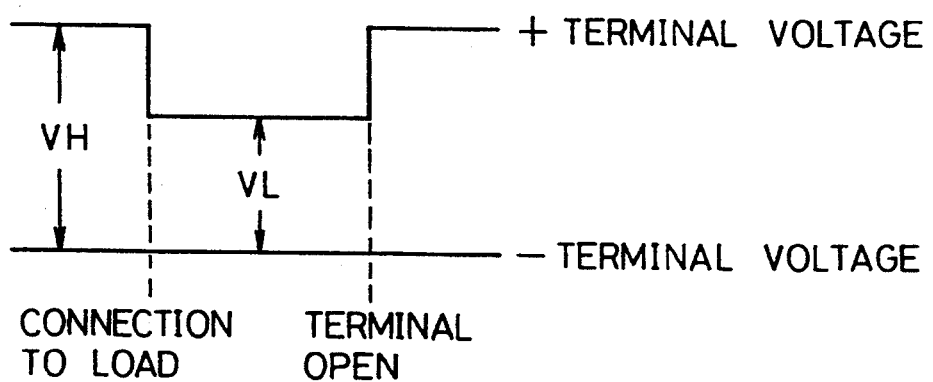
FIG. 3 is a diagram showing a change of terminal voltage during operation of the switching means according to a preferred embodiment of the invention.

Referring to FIG. 3, the internal resistance calculating section 14 calculates an internal resistance value r of the battery 1 based on signals inputted from the input circuit section 8, i.e., a terminal voltage value VH at the moment when terminals are opened by the switching circuit section 10, a terminal voltage value VL at the moment when terminals are connected only to the load 4, and a discharge current value I to the load 4 thereon according to the equation $r = (VH - VL)I$. Whereas, strictly speaking, the discharge current I includes a very small current supplied to the control unit 2, however since this current is negligibly small, compared to the current to the load 4, the current to the control unit 2 is not taken into consideration in the calculation.

Figure 4:
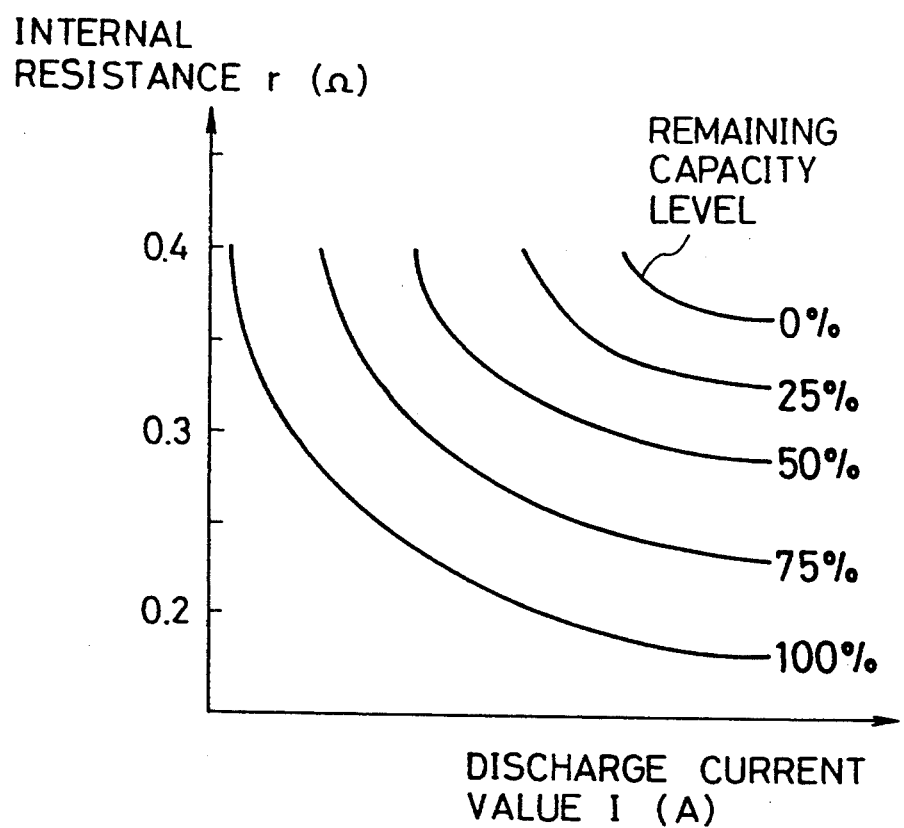
FIG. 4 is a schematic diagram showing a capacity data map according to a preferred embodiment of the invention.

Further, the capacity data memory section 17, as shown in FIG. 4, remaining capacity levels C (%) are stored on a two-dimensional map parameterizing an internal resister value r of the battery 1 and a discharge current value I. Further, in the capacity estimating section 15, a remaining capacity level C is estimated by referring to the two-dimensional map of the capacity data memory section 17 based on an internal resistance value signal r from the internal resistance calculating section 14 and discharge current value signal I. Thus it is understood that a remaining capacity level C is decreased if an internal resistance value r of the battery 1 is increased like in a case where positive or negative plates are deteriorated, even when a discharge current value I is not changed.

Whereas, since the remaining capacity level C thus obtained varies according to the change of the electrolyte temperature, it is necessary that this remaining capacity level C is converted into a remaining capacity level at an average or standard temperature condition of electrolyte.

For this purpose, in the temperature correction coefficient memory section 18, temperature correction coefficients K have been experimentally obtained beforehand in a relationship with an electrolyte temperature t and a remaining capacity level C and are stored on a map. When a remaining capacity level C is determined as described above, a temperature correction coefficient K is obtained by referring to the map based on an electrolyte temperature data t from the input circuit section 8. Thus, a corrected remaining capacity level Ct is obtained by multiplying the above remaining capacity rating C and the above temperature correction coefficient K (Ct=K.C), and is outputted to the indicator 13.

Figure 5:
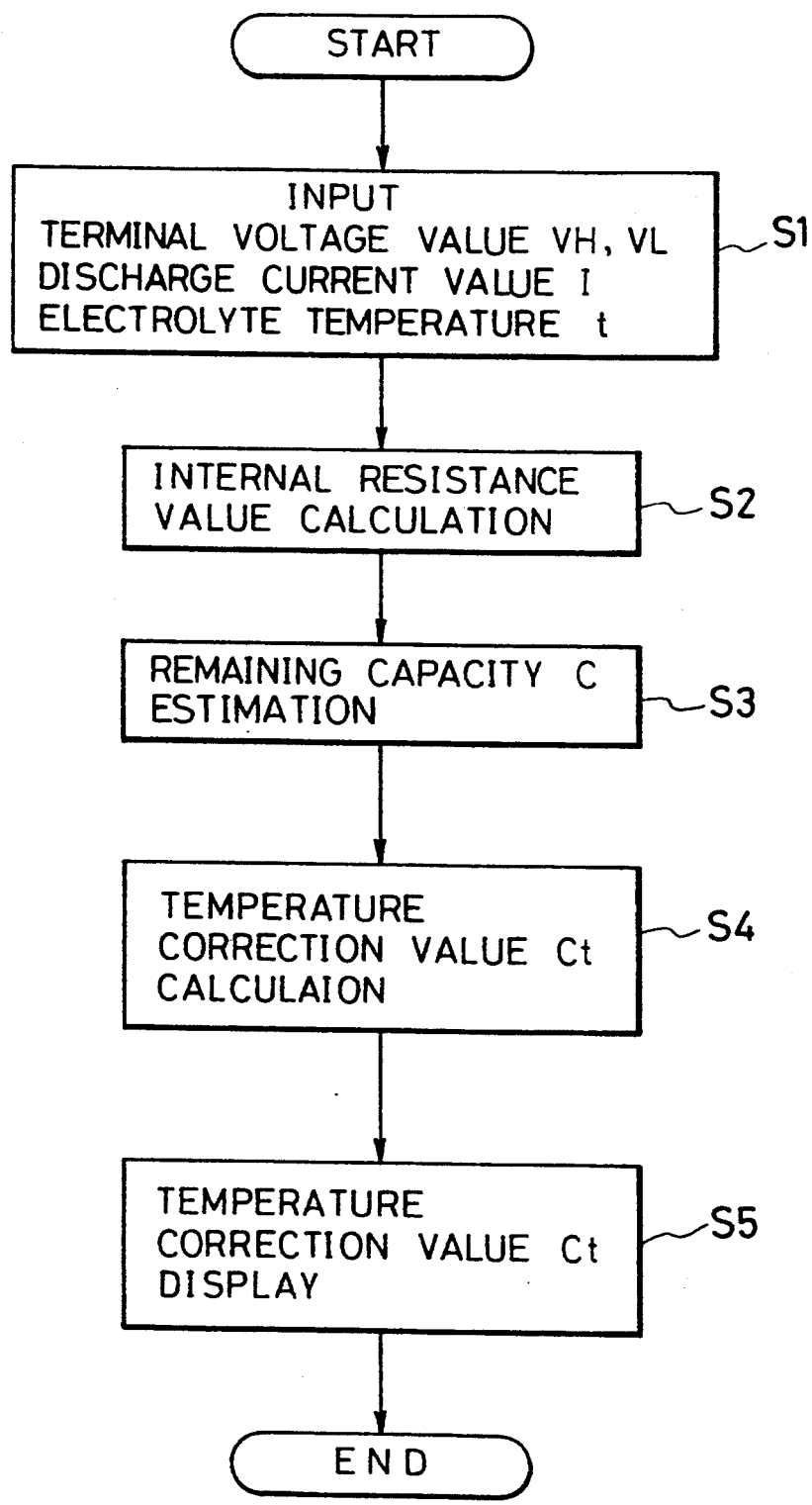
FIG. 5 is a flowchart describing the operation of the preferred embodiment.

Next, an operation of the preferred embodiment of the battery capacity estimating system thus constituted will be described according to a flowchart shown in FIG. 5.

First, at a step S1 a terminal voltage value VH, a terminal voltage value VL and a discharge current value I at the terminal voltage VL are inputted from the input circuit section 8 to the internal resistance calculating section by an operation of the switching circuit section for a very short period of time, for example, 0.1 mm second, based on a command from the CPU 7 and, on the other hand, at the same time, an electrolyte temperature t of the battery 1 is inputted from the input circuit section 8 to the temperature correcting section 16.

Then, at a step S2 an internal resistance r of the battery 1 is calculated according to a formula r=(VH−VL)I in the internal resistance calculating section 14.

Then, at a step S3 a remaining capacity level C is estimated by referring to the capacity data memory section 17 based on the internal resistance value r and the discharge current value I in the capacity estimating section 15.

Then, at a step S4 in the temperature correcting section 16 a temperature correction coefficient K is obtained by referring to the temperature correction coefficients memory section 18, based on the electrolyte temperature t from the input circuit section 8 and a corrected remaining capacity level Ct of the battery 1 is calculated according to the formula Ct=K.C, based on the remaining capacity level from the capacity estimating section 15.

Finally, at a step S5 the corrected remaining capacity level Ct is outputted to the indicator 13 for display.

In this embodiment the load 4 is assumed to be a general electric load on an automobile, such as auxiliary electric equipments or lighting equipments. However, the load 4 may be replaced with a resistance whose resistance value R is known. In this case, since a discharge current value I is expressed as VL/R, an internal resistance r is obtained in accordance with an equation r=(VH−VL).(R/VL). Accordingly, then the current sensor 5 can be omitted in this case.

In summary, the battery capacity estimating system according to the present invention is characterized in being able to estimate and display a remaining capacity of a battery (battery capacity) accurately by an instantaneous switching control in a simple control circuit regardless of the battery conditions, such as electrolyte temperature or a state of deterioration in batteries. Further, according to the battery capacity estimating system, since a battery capacity can be calculated and displayed instantaneously, a vehicle driver can monitor the battery capacity of his or her vehicle at any time even during operation.

While the presently preferred embodiment of the present invention has been shown and described, it is to be understood that this disclosure is for the purpose of illustration and that various changes and modifications may be made without departing from the scope of the invention as set forth in the appended claims.

I claim:

1. A remaining capacity measuring system for a rechargeable storage battery of an automobile, comprising:

first switching means responsive to a command signal from an electronic control unit for setting said battery in a disconnected state to all of electrical loads of said automobile except said electronic control unit;

second switching means responsive to another command signal from said electronic control unit for setting said battery in a selectively connected state to an electrical load excluding said electronic control unit;

first voltage detecting means for detecting a first voltage between a positive and negative terminal of said battery in said disconnected state;

second voltage detecting means for detecting a second voltage between a positive and negative terminal of said battery in said selectively connected state;

discharge current detecting means for detecting a discharge current flowing between said battery and said electrical load in said selectively connected state;

temperature sensing means for sensing an electrolyte temperature of said battery;

input signal converting means for converting analogue signals of said first voltage signal, said second voltage signal, said discharge current signal and said electrolyte temperature signal, into digital signals and for outputting said digital signals to a CPU of said electronic control unit;

internal resistance calculating means for calculating an internal resistance value of said battery based on said first voltage signal from said input signal converting means, said second voltage signal from said input signal converting means and said discharge current signal from said input signal converting means and for outputting said internal resistance value;

capacity data memory means for storing a remaining capacity level of said battery on a first map parameterizing an internal resistance value and a discharge current value;

capacity estimating means for reading said remaining capacity level corresponding to said internal resistance value and said discharge current value on said first map and for outputting said remaining capacity level;

correction coefficients memory means for storing a temperature correction coefficient on a second map parameterizing an electrolyte temperature;

capacity correcting mean for reading said temperature correction coefficient corresponding to said electrolyte temperature from said second map, for correcting said remaining capacity level outputted from said capacity estimating means by said temperature correction coefficient, and for outputting a corrected remaining capacity level; and display means for displaying said corrected remaining capacity level outputted from said temperature correcting means.

2. The remaining capacity measuring system according to claim 1, wherein said internal resistance value is obtained by means of dividing a difference between said first voltage value and said second voltage value by said discharge current value.

3. A remaining capacity measuring system for a rechargeable chargeable storage battery of an automobile, comprising:

first switching means responsive to a command signal from an electronic control unit for setting said battery in a disconnected state to all of electrical loads of said automobile except said electronic control unit;

second switching means responsive to another command signal from said electronic control unit for setting said battery in a selectively connected state to a reference resistance whose resistance value is known;

first voltage detecting means for detecting a first voltage value between a positive and negative terminal of said battery in said disconnected state;

second voltage detecting means for detecting a second voltage value between a positive and negative terminal of said battery in said selectively connected state;

temperature sensing means for sensing an electrolyte temperature of said battery;

input signal converting means for converting analogue signals of said first voltage value signal, said second voltage value signal, and said electrolyte temperature signal, into digital signals and for outputting said digital signals to a CPU of said electronic control unit;

discharge current calculating means responsive to said second voltage value signal from said input signal converting means for calculating a discharge current value based on a resistance value of said reference resistance and for outputting said discharge current;

internal resistance calculating means for calculating an internal resistance value of said battery based on said first voltage value from said input signal converting means, said second voltage value signal from said input signal converting means and said discharge current value signal from said discharge current calculating means and for outputting said internal resistance value signal;

capacity data memory means for storing a remaining capacity level of said battery on a first map parameterizing an internal resistance value and an discharge current value;

capacity estimating means for reading said remaining capacity level corresponding to said internal resistance value and said discharge current value on said first map and for outputting said remaining capacity level;

correction coefficients memory means for storing a temperature correction coefficient on a second map parameterizing an electrolyte temperature;

capacity correcting means for reading said temperature correction coefficient corresponding to said electrolyte temperature from said second map, for correcting said remaining capacity level outputted from said capacity estimating means by said temperature correction coefficient, and for outputting a corrected remaining capacity level; and display means for displaying said corrected remaining capacity level outputted from said temperature correcting means.

4. The remaining capacity measuring system according to claim 3, wherein said discharge current is obtained by means of dividing said second voltage by said resistance value of said reference resistance.

5. The remaining capacity measuring system according to claim 3, wherein said internal resistance value is obtained by means of dividing a difference between said first voltage value and said second voltage value by said discharge current value.

6. The remaining capacity measuring system according to claim 3, wherein said reference resistance is replaced with at least one electrical equipment of said automobile whose resistance value is known.

7. A method of measuring a remaining capacity of battery for an automobile, comprising the steps of:

setting said battery in a disconnected state to all of electrical loads of said automobile except an electronic control unit;

setting said battery in a selectively connected state to an electrical load excluding said electronic control unit;

detecting a first voltage between a positive and negative terminal of said battery in said disconnected state;

detecting a second voltage between a positive and negative terminal of said battery in said selectively connected state;

detecting a discharge current flowing between said battery and said electrical load in said selectively connected state;

sensing an electrolyte temperature of said battery;

converting analogue signals of said first voltage signal, said second voltage signal, said discharge current signal and said electrolyte temperature signal, into digital signals and outputting said digital signals to a CPU of said electronic control unit;

calculating an internal resistance value of said battery based on said first voltage signal, said second voltage signal and said discharge current signal and outputting said internal resistance value;

storing a remaining capacity level of said battery on a first map parameterizing an internal resistance value and a discharge current value;

reading said remaining capacity level corresponding to said internal resistance value and said discharge current value on said first map and outputting said remaining capacity level;

storing a temperature correction coefficient on a second map parameterizing an electrolyte temperature;

reading said temperature correction coefficient corresponding to said electrolyte temperature on said second map, correcting said remaining capacity by said temperature correction coefficient and outputting a corrected remaining capacity level; and displaying said corrected remaining capacity level.

8. The method according to claim 7, wherein said internal resistance value is obtained by means of dividing a difference between said first voltage value and said second voltage value by said discharge current value.

9. A method of measuring a remaining capacity of a battery for an automobile, comprising the steps of:

setting said battery in a disconnected state to all of electrical loads of said automobile except said electronic control unit;

setting said battery in a selectively connected state to a reference resistance whose resistance value is known;

detecting a first voltage value between a positive and negative terminal of said battery in said disconnected state;

detecting a second voltage value between a positive and negative terminal of said battery in said selectively connected state;

sensing an electrolyte temperature of said battery;

converting analogue signals of said first voltage value signal, said second voltage value signal, and said electrolyte temperature signal, into digital signals and outputting said digital signals to a CPU of said electronic control unit;

calculating a discharge current value based on said second voltage value and a resistance value of said reference resistance;

calculating an internal resistance value of said battery based on said first voltage value, said second voltage value and said discharge current value and outputting said internal resistance value signal;

storing a remaining capacity level of said battery on a first map parameterizing an internal resistance value and an discharge current value;

reading said remaining capacity level corresponding to said internal resistance value and said discharge current value on said first map and outputting said remaining capacity level;

storing a temperature correction coefficient on a second map parameterizing an electrolyte temperature;

reading said temperature correction coefficient corresponding to said electrolyte temperature on said second map, correcting said remaining capacity level by said temperature correction coefficient, and outputting a corrected remaining capacity level; and displaying said corrected remaining capacity level.

10. The method according to claim 9, wherein said discharge current is obtained by means of dividing said second voltage by said resistance value of said reference resistance.

11. The method according to claim 9, wherein said internal resistance value is obtained by means of dividing a difference between said first voltage value and said second voltage value by said discharge current value.

12. The method according to claim 9, wherein said reference resistance is replaced with at least one electrical equipment of said automobile whose resistance value is known.

* * * * *